US007933207B2

(12) United States Patent
Van Dalen et al.

(10) Patent No.: US 7,933,207 B2
(45) Date of Patent: Apr. 26, 2011

(54) ELECTRONIC STREAM PROCESSING CIRCUIT WITH TEST ACCESS

(75) Inventors: Edwin Jan Van Dalen, Eindhoven (NL); Paulus Wilhelmus Franciscus Gruijters, Eindhoven (NL)

(73) Assignee: NXP B.V., Eindhoven (NL)

( * ) Notice: Subject to any disclaimer, the term of this patent is extended or adjusted under 35 U.S.C. 154(b) by 1172 days.

(21) Appl. No.: 10/589,922

(22) PCT Filed: Feb. 2, 2005

(86) PCT No.: PCT/IB2005/050438
§ 371 (c)(1),
(2), (4) Date: Aug. 17, 2006

(87) PCT Pub. No.: WO2005/083455
PCT Pub. Date: Sep. 9, 2005

(65) Prior Publication Data
US 2007/0165681 A1   Jul. 19, 2007

(30) Foreign Application Priority Data

Feb. 19, 2004  (EP) .................................... 04100657

(51) Int. Cl.
| | |
|---|---|
| *G01R 31/08* | (2006.01) |
| *G01R 27/28* | (2006.01) |
| *G01R 31/00* | (2006.01) |
| *G01R 31/14* | (2006.01) |
| *G06F 11/00* | (2006.01) |
| *G08C 15/00* | (2006.01) |
| *H04J 1/16* | (2006.01) |
| *H04J 3/14* | (2006.01) |
| *H04L 1/00* | (2006.01) |
| *H04L 12/26* | (2006.01) |
| *H04L 12/28* | (2006.01) |
| *H04L 12/54* | (2006.01) |

(52) U.S. Cl. ........................................ 370/241; 702/118
(58) Field of Classification Search .................... None
See application file for complete search history.

(56) References Cited

U.S. PATENT DOCUMENTS 5,481,186 A * 1/1996 Heutmaker et al. ....... 324/158.1
(Continued)

FOREIGN PATENT DOCUMENTS

CN    1 319 209 A    10/2001
(Continued)

OTHER PUBLICATIONS

J. Li, H. Huang, J. Chen, C. Su, C. Wu, C. Cheng, S. Chen, C. Hwang, H. Lin, A Hierarchical Test Methodology for Systems on Chip, IEEE Micro, vol. 22, Issue 5, Sep. 2002, pp. 69-81.*

(Continued)

*Primary Examiner* — Daniel J Ryman
*Assistant Examiner* — Christopher Crutchfield

(57) ABSTRACT

Consistent with an example embodiment, there is a signal processing circuit. Linking multiplexing (L-MUX) circuits, link respective pairs of stream processing circuits. Each L-MUX circuit is individually switchable to a normal mode and a replacement mode; in normal mode, it passes a first stream of samples values between the stream processing circuits in the respective pair of the L-MUX circuits; in replacement mode, it supplies successive sample values from a second stream from the communication structure to a receiving one of the stream processing circuits in the respective pair. A control circuit keeps a selectable one of the multiplexing circuits in the replacement mode so the selectable one of the L-MUX circuits passes a stream of successive samples from the second stream to the receiving one of the processing circuits in the respective pair of L-MUX circuits, while keeping at least part of the other L-MUX circuits in the normal mode.

6 Claims, 3 Drawing Sheets

U.S. PATENT DOCUMENTS

Figure 1:
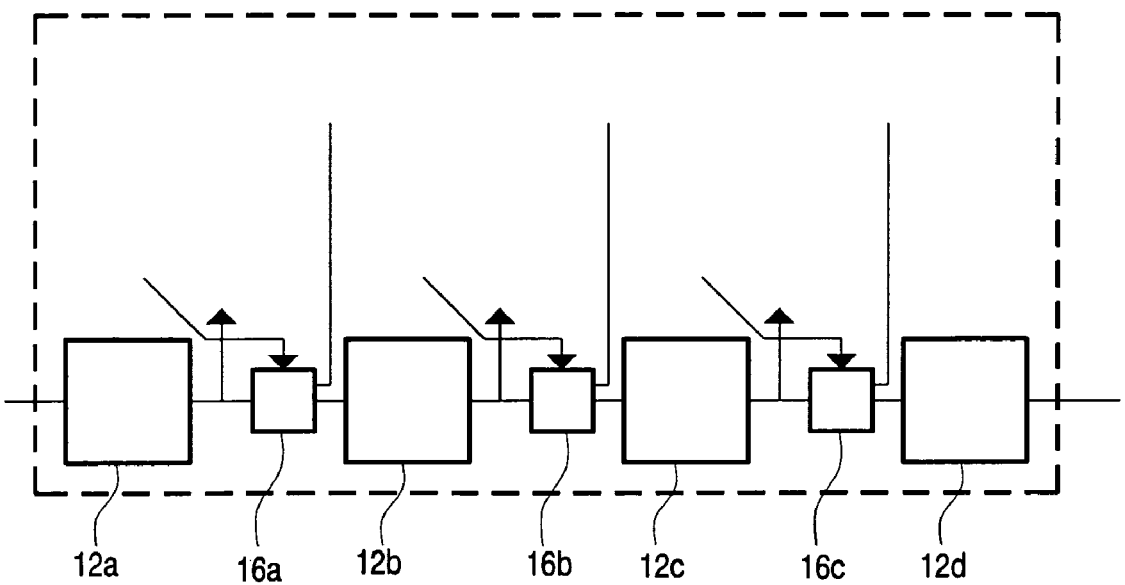

| | | |
|---|---|---|
| 6,988,230 B2 | 1/2006 | Vermeulen et al. |
| 7,054,989 B2 | 5/2006 | Mizobata |
| 7,100,020 B1 | 8/2006 | Brightman et al.* |
| 2003/0056165 A1 | 3/2003 | Whetsel et al. |

FOREIGN PATENT DOCUMENTS

| | | |
|---|---|---|
| CN | 1 406 063 A | 3/2003 |
| JP | 07-294604 A | 11/1995 |
| JP | 2005-503563 A | 2/2005 |
| WO | 03/025595 A | 3/2003 |

OTHER PUBLICATIONS

S. Oakland, Considerations for Implementing IEEE 1149.1 on System-on-a-Chip Integrated Circuits, Proceedings of the 2000 IEEE International Test Conference, pp. 628-637.*

J. Son, S. Park, A Simple Wrapped Core Linking Module for SoC Test Access, Proceedings of the 11th Asian Test Symposium, pp. 344-350, 2000.*

J. Mitola, Software Radio Architecture: A Mathematical Perspective, IEEE Journal on Selected Areas in Communications, vol. 17, No. 4, Apr. 1999, pp. 514-538.*

S. Srikanteswara, J. Reed, P. Athanas, R. Boyle, A Soft Radio Architecture for Reconfigurable Platforms, IEEE Communications Magazine, Feb. 2000, pp. 140-147.*

E. Marinissen I , Y. Zorian , R. Kapur , T. Taylor and L. Whetsel, Towards a Standard for Embedded Core Test: An Example, Proceedings of the IEEE International Test Conference, pp. 616-627, 1999.*

E. Marinissen, R. Kapur, M. Lousberg, T. McLaurin, M. Ricchetti and Y. Zorian, On IEEE P1500's Standard for Embedded Core Test, Journal of Electronic Testing, Springer Netherlands, Issue vol. 18, Nos. 4-5, Aug. 2002, pp. 365-383.*

Y. Zorian, E. Marinissen I, S. Dey, Testing Embedded-Core Based System Chips, Proceedings of the IEEE International Test Conference, 1998, pp. 130-143.*

* cited by examiner

ELECTRONIC STREAM PROCESSING CIRCUIT WITH TEST ACCESS

The invention relates to electronic signal processing circuits, in particular to integrated signal processing circuits and to testing and patching of such circuits.

Test access to an integrated circuit is conventionally realized using a scan chain. In an integrated circuit with a scan chain different functional circuits are coupled to each other via scan cells. In a normal operating mode the scan cells pass binary signals from one functional circuit to another. The circuit can be switched to a test mode, wherein scan registers from the scan cells can be coupled to each other as a serial shift register. Via this shift register binary signals can be transported to and from specific circuits inside the integrated circuit. To ensure testability usually all registers of the integrated circuit are part of the scan chain, making access generally very slow, due to the need for serial shifting. The specific sequence of scan cells in the serial shift register does not matter for scan testing.

A high throughput signal processing circuit that handles streams of sample values preferably use a network of stream processing circuits. A typical example of a stream processing circuit is a filter circuit, which produces a stream of successive output samples that the stream processing circuit each determines by computing a weighted sum of successive input values from an input stream. In general each stream processing circuit receives an input stream of successive sample values, typically from another stream processing circuit, uses the sample values from that input stream as operands for executing its dedicated function and produces an output stream of sample values that result from the execution. The output stream is generally used as input stream by a next stream processing circuit in the network.

One important strength of using a network is that the streams are passed by separate stream transport interconnections between the stream processing circuits, so that the sample rate of different streams is not limited by contention, as would be the case for example if a communication bus would be used. The interconnections typically are mere conductors, connected as exclusive a point-to-point connections between pairs of stream processing circuits.

Once a network of stream processing circuits has been designed it is preferably implemented in an integrated circuit. Once the network has been integrated it becomes difficult to access the circuit other than through the normal inputs and outputs. This restricts the possibilities of testing the circuit once it has been integrated. Such a signal processing can be tested using a scan chain, but testing is generally very slow, due to the need for serial shifting. During testing the speed of a network of interconnected stream processing circuits is not even remotely approached. Moreover, when design errors prevent satisfactory operation, manufacture of redesigned integrated circuits is necessary before the integrated circuit can be used in products.

Among others, it is an object of the invention to provide for an electronic signal processing circuit with signal stream processing circuits that are interconnected in a network of stream transport connections, and which provides for high-speed access to streams within the network.

Among others, it is an object of the invention to provide for such an electronic signal processing circuit that is able to operate at normal speed while replacement parts take over the function of a selectable part of its stream processing circuits.

The electronic signal processing circuit according to the invention is set forth in claim 1. Typically, the circuit is contained on an integrated circuit chip. The circuit contains, in addition to the normal stream transport interconnections between pairs of stream processing circuits, a shareable access structure, which is not used during normal operation of the circuit. Over the shareable access structure a stream of samples can be transported to a selectable one of the stream processing circuits, to replace its input stream. This is realized by a mode switch of a multiplexer that establishes a time-continuous coupling for passing the sample values so that successive sample values from the stream are passed without having to re-establish the connection for each sample.

Compared to scan access test data can be transferred into and out of the circuit more rapidly, with less overhead, less routing problems and without interrupting operation.

Preferably, the shareable access structure also permits a mode wherein a stream of samples is transported from a selectable one of the stream processing circuits. This makes it possible to monitor the output of selected stream processing circuits. More preferably, an output stream and an input stream from selected stream processing circuits can be passed simultaneously through the shareable access structure. This makes it possible to monitor the effect of individual ones of the stream processing circuits by supplying a test input stream and extracting a resulting output stream from a selectable one of the stream processing circuits. Alternatively, it makes it possible to test or repair a circuit, by functionally replacing the stream processing function of a selectable one of the stream processing circuits by an external circuit.

Preferably, the shareable access structure is realized as a chain of multiplexing circuits, each of which can be individually switched to a mode to pass a stream of sample values from its predecessor in the chain or from the stream output of an associated stream processing circuit. In this embodiment the interconnection topology of the chain of multiplexing circuits corresponds to the interconnection topology of the network of stream processing circuits. Thus, the multiplexers in the chain can concurrently be in modes to pass an input stream to and an output stream from selected stream processing circuits via upstream and downstream parts of the chain of multiplexers respectively. This minimizes the wiring needed for the shareable communication structure. Various forms of connections to the stream processing circuits may be used to facilitate such concurrent streams.

In an embodiment, the circuit contains multiple sets of stream processing circuits and multiple shareable access structures, as well as a router circuit that enables various connection patterns between the shareable access structures. In a receiver/transmitter circuit, for example, this makes it possible to perform partial loopback tests.

Figure 1A:
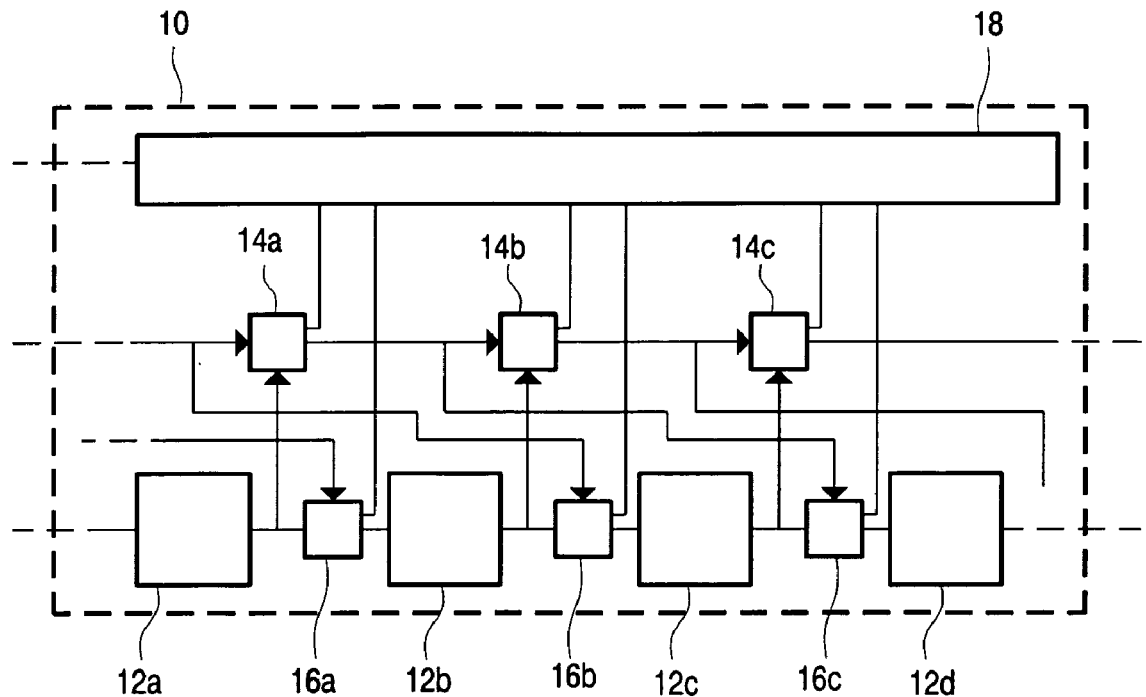
Figure 2:
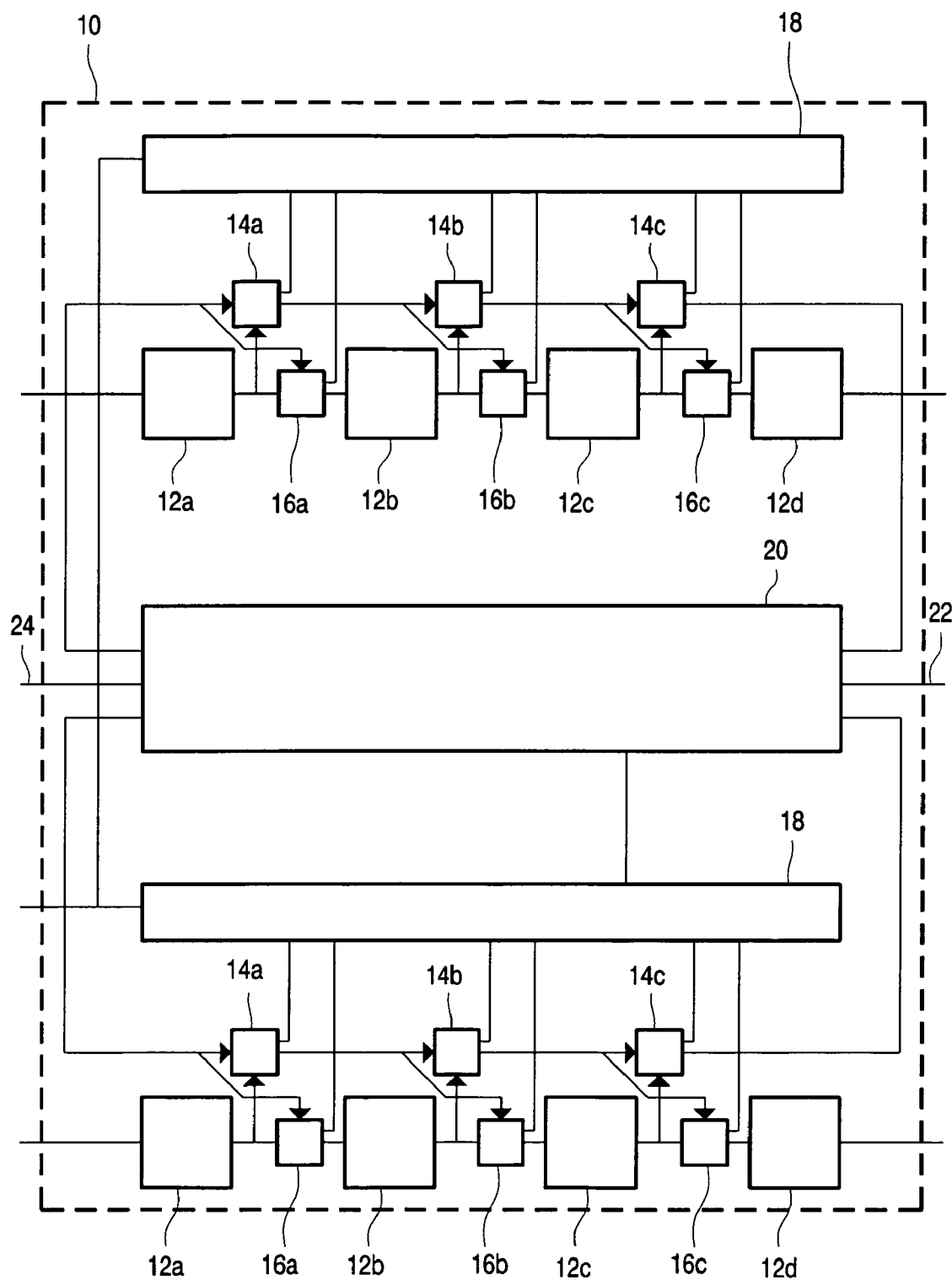
Figure 3:
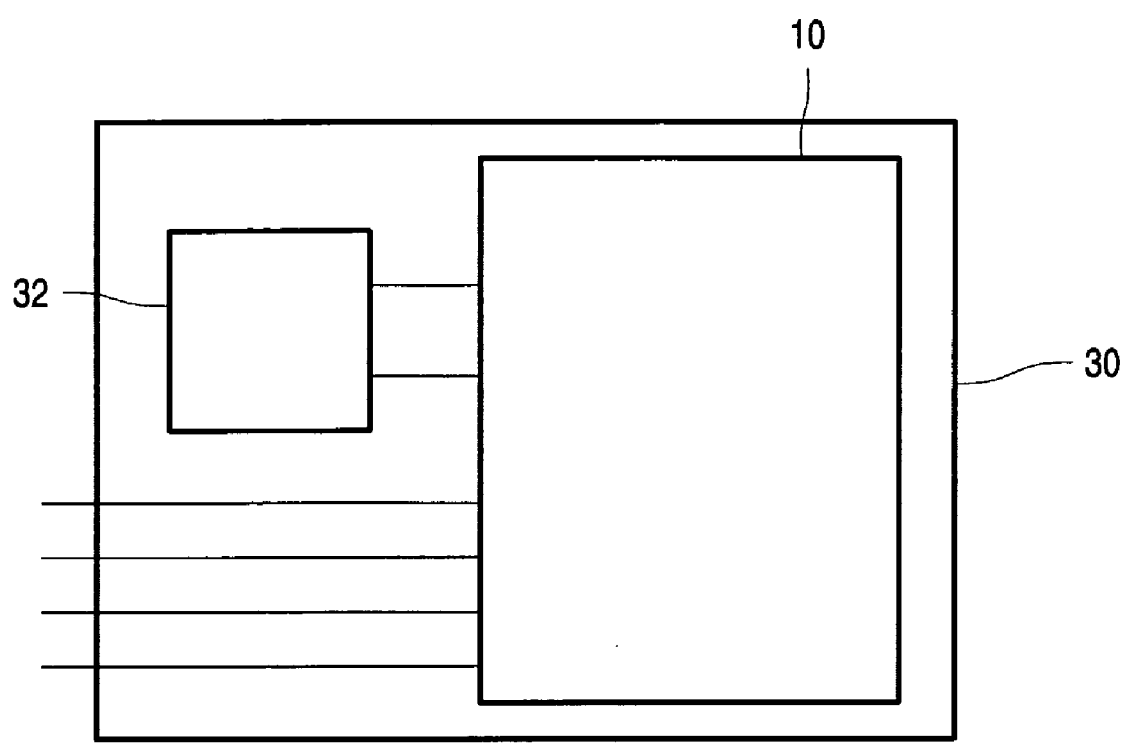

These and other objects and advantages of the invention will be described using examples of embodiments, using the following figures FIG. 1, 1a show a signal processing circuit;
FIG. 2 shows a further signal processing circuit;
FIG. 3 shows a circuit module.

FIG. 1 shows a signal processing integrated circuit 10 with a plurality of stream processing circuits 12a-d, first multiplexers 14a-c, second multiplexers 16a-c and a control circuit 18. Stream processing circuits 12a-d are coupled in chain, each except last stream processing circuit 12d having a stream output coupled to a next stream processing circuit 12b-d in the chain via a respective one of the second multiplexers 16a-c. Each second multiplexer 16a-c has a first input coupled to a stream output of a preceding stream processing circuit 16a-c and an output coupled to the stream input of a succeeding stream processing circuit 12b-d. Although single lines are shown as connections it should be understood that typically each connection between successive stream processing circuits 12a-d contains a plurality of signal conductors, in order to pass all bits of a multi-bit sample value in parallel.

First multiplexers are also coupled in a chain, each except initial first multiplexer 14a having a first input coupled to an output of a preceding first multiplexer 14a,b. Second inputs of first multiplexers 14a-c are coupled to stream outputs of respective ones of the stream processing circuits. The first inputs of first multiplexers 14a-c are coupled to second inputs of respective second multiplexers 16a-c. Although single lines are shown as connections it should be understood that typically each input and output of first and second multiplexers 14a-c, 16a-c contains a plurality of signal conductors, in order to pass all bits of a multi-bit sample value in parallel.

The first input of an initial first multiplexer 14a-c in the chain is coupled to an external terminal or terminals of integrated circuit 10. Similarly, the output of a final first multiplexer 14a-c in the chain is coupled to an external terminal or terminals of integrated circuit 10. Control circuit 18 has control outputs coupled to control inputs of respective ones of first and second multiplexers 14a-c, 16a-c.

In operation, integrated circuit 10 is operable alternatively in a normal stream processing mode and in a test mode, selected under control of control circuit 18. In the normal stream processing mode control circuit 18 controls each of second multiplexers 16a-c to pass a stream of signal samples from the stream output of one stream processing circuit 12a-d to another. Typically each stream processing circuit repeatedly performs one or a few processing functions on the stream, each for a respective input sample value or block of such sample values, to compute successive output sample values each from a respective input sample value of block of input sample values. Typical examples of stream processing units include Fourier transform processors, which compute and output the Fourier transform coefficients of a block of input sample values, compression or decompression processors, error correcting code encoders or decoders, interleavers etc. In the normal operating mode the chain of first multiplexers 14a-c has no function.

In the test mode control circuit 18 controls first and second multiplexers 14a-c, 16a-c to feed the stream of sample values from a the stream output of a selectable one of stream processing circuits 12a-d to an external terminal and/or to feed a stream of sample values to the stream input of a selectable one of the stream processing circuits 12a-d. Thus, the relevant second multiplexers 16a-c are switched to a bypass mode in which a stream of samples from the chain of first multiplexers 14a-c bypasses the normal output stream. In the test mode control circuit 18 makes second multiplexers 16a-c couple stream inputs and outputs of the other stream processing circuits to each other as in the normal mode. Control circuit 18 receives external commands to select from which of the stream processing circuits 12a-d the stream input and/or stream output is coupled to the external terminals of integrated circuit 10. Once these commands have been effected control circuit 18 keeps the commanded connections active, so that a stream of successive samples is passed without requiring further switching.

Thus the output stream of a can be extracted from a selectable one of the stream processing circuits 12a-d, so that the sample values in this stream can be compared with sample values from a reference stream, for example in a test equipment (not shown). Similarly, a test stream of sample may be fed as input stream into a selectable one of the stream processing circuits 12a-d, in order to detect whether it causes a part of the network of stream processing circuits 12a-d to produce sample values corresponding to a reference stream. In a further test, different streams may be fed into and out of the network at selected points in the network at the same time. This makes it possible to supply a test stream to a selected stream processing circuit and to monitor the resulting output stream at the output of that stream processing circuit, or a the output of a stream processing circuit further downstream.

Alternatively, it makes it possible to functionally eliminate a stream processing circuit or a sub-chain of such stream processing circuits from the network, by extracting an input stream of a stream processing circuit, processing this extracted stream externally and feeding the resulting stream back into the network. In this way it can be tested whether the network works well if errors from a selected stream processing circuit or sub-chain of such stream processing circuit can be excluded. Also, the circuit can be repaired in this way, or its functional capabilities can be expanded. Typically, this is done by extracting the input stream of a selected stream processing circuit or sub-chain and replacing its output stream by results that have been computed externally. But in another alternative one may correct the extracted input stream and supply the corrected input stream-to-stream input of the selected stream processing circuit.

Preferably, as shown in FIG. 1 the chain of first multiplexers 14a-c runs in parallel with the chain of signal processing circuits 12a-d, so that each first multiplexer 14a-c that has an input coupled to the stream output of a particular stream processing circuit 12a-d has an output coupled to the first multiplexer 14a-c that has its input coupled to the successor of the particular stream processing circuit 12a-d. In this way input and output streams can be transmitted in parallel.

For example, in the circuit of FIG. 1 an input stream of samples can be transported through the chain of first multiplexers 14a-c to the stream input of a selected stream processing circuit 12a-d at the same time as an output stream of samples from the stream output of that selected stream processing circuit. Thus that selected stream processing circuit 12a-d can be tested in isolation. Similarly, the stream of output samples from a selected stream processing circuit 12a-d can be output from integrated circuit 10, processed (e.g. corrected, or selectively replaced by test samples) and fed back to the stream input of the stream processing circuit 12a-d that follows the selected stream processing circuit 12a-d.

FIG. 1a shows an alternative way of connecting the inputs of second multiplexers 16a-c. An integrated circuit 10 with four signal processing circuits 12a-d are shown, but it will be understood that more (not shown) may be present. In this embodiment each second multiplexer 16a-c has its first input coupled to the stream output a particular signal processing circuit 12a-d and its second input coupled to the input of a first multiplexer 14a-c of which the other input is coupled to the stream input of particular signal processing circuit 12a-d (in the example of FIG. 1a via another second multiplexer 16a-c). This makes it possible to "replace" the particular stream processing circuit 16a-d by a stream processing circuit (not shown) external to integrated circuit. To do so control circuit 18 controls first and second multiplexers so that the stream of input samples of the particular stream processing circuit 16a-d is output from the integrated circuit and a processed stream is supplied to the chain of stream processing circuits 12a-d instead of the output stream from the particular stream processing circuit 16a-d.

As an alternative a second chain of first multiplexers (not shown) may be provided in parallel with first multiplexers 14a-d, so that input streams are fed to the signal processing circuits 12a-d via the first chain of first multiplexers 14a-d and output streams are extracted from the signal processing circuits 12a-d via the second chain of first multiplexers. Alternatively, two sets of bus lines may be used, each first multiplexer comprising tri state drivers controlled by control circuit 18 to drive a first set of bus lines with sample bit values from the stream output of a respective stream processing circuit 12*a-d* and each second multiplexer 16*a-d* having an input coupled to the second set of bus lines for receiving the samples of an input stream. However this type of solution requires an additional set of signal conductors, which increases silicon area.

FIG. 2 shows a further signal processing circuit. This circuit contains two branches, each with of chains of the type shown in FIG. 1 and a router circuit 20 which has inputs coupled to the outputs of the chains of first multiplexers 14*a-c* of the two branches and an external input 22 of integrated circuit 10 and outputs coupled to the inputs of the chains of first multiplexers 14*a-c* of the two branches and an external output 24 of integrated circuit 10. Router circuit 20 is controlled by control circuit 18.

In a typical example, the processing circuits 12*a-d* of the first branch implement receiver processing functions (e.g. Fourier transformation, followed by demodulation, interleaving, error correction etc.) and the processing circuits 12*a-d* of the second branch implement transmitter processing functions that are the inverse of the transmitter processing functions (e.g. error correcting coding followed by interleaving, modulation and Fourier transformation).

Router circuit may be of a type known per se which provides for combined connection of several inputs to several outputs. Router circuit 20 is arranged to provide different selectable coupling patterns between its inputs and outputs under control of control circuit. In a first pattern router circuit 20 couples its external input 22 to the input of the chain of first multiplexer circuits 14*a-d* of a first branch and its external output 24 to the output of the chain of first multiplexer circuits 14*a-d* of the first branch. In this pattern the first branch can be tested. In a second pattern router circuit 20 couples its external input 22 to the input of the chain of first multiplexer circuits 14*a-d* of a second branch and its external output 24 to the output of the chain of first multiplexer circuits 14*a-d* of the second branch. In this pattern the second branch can be tested.

In a third pattern router circuit 20 couples the input of the chain of first multiplexer circuits 14*a-d* of the first branch to the output of the chain of first multiplexer circuits 14*a-d* of the second branch. In this pattern streams of signal samples can be fed from the stream outputs of selected stream processing circuits 12*a-d* of the second branch to the stream inputs of selected stream processing circuits 12*a-d* of the first branch.

When the stream processing circuits 12*a-d* of the first branch perform receiver functions and the stream processing circuits 12*a-d* of the first branch perform transmitter functions this facilitates loopback testing, wherein a partial output, produced by a part of the chain of signal processing circuits 12*a-d* in the transmitter branch is injected at a corresponding stage in the chain of the receiver branch, in order to locate the possible origin of a lack of reciprocity between transmission and reception.

In the third pattern router circuit 20 may also couple the input of the chain of second multiplexer circuits 14*a-d* to external input 22 and the output of the chain of first multiplexer circuits 14*a-d* to the external output 24, so that streams of successive samples can be passed without further switching. This facilitates one by one testing of the reciprocity of individual signal processing circuits 12*a-d*, by feeding in a test stream of samples, coupling this test stream to the stream input of a selected signal processing circuit of the transmitter branch, coupling the output stream of that selected signal processing circuit to the stream input of its inverse signal processing circuit in the receiver branch and feeding the resulting output stream to the external output 24.

Router circuit may also provide for a fourth pattern, wherein the roles of the first and second branch are exchanged compared with the third pattern.

FIG. 3 shows a circuit module 30 that contains an integrated circuit 10 as described in the preceding, as well as a correction circuit 32, which is coupled to integrated circuit 10 via the terminals that are coupled to the input and output of the chain of first multiplexers 14*a-c* (not shown). For example, a circuit module may be a printed circuit board, or an encapsulated module for use on a printed circuit board. The module of the figure may be used to correct or modify the function of integrated circuit beyond what is possible by normal programming. In this implementation correction circuit 32 for example receives the input and output streams of a selected one of stream processing circuits 12*a-d*. In this way a design error in the selected one of stream processing circuits 12*a-d* can be corrected without redesigning integrated circuit, or functional limitations of integrated circuit 10 can be overcome for special applications. Of course, instead of replacing a single selected stream processing circuit 12*a-d* of integrated circuit 10, correction circuit 32 may replace a series of more than one selected stream processing circuits 12*a-d* of integrated circuit 10, or perform an additional signal processing function inserted between two successive stream processing circuits 12*a-d* of integrated circuit 10.

Although the invention has been described by reference to specific embodiments it will be appreciated that many variations are possible. For example, clocked registers may be inserted at various positions in the data paths, for example between pairs of successive first multiplexers 14*a-c*, to simplify timing requirements. Similarly, of course a larger or smaller number of stream processing circuit may be used, with correspondingly larger or smaller numbers of fist and second multiplexer circuits 14*a-c*, 16*a-c*. Some or all of stream processing circuits 12*a-d* may be made up of combinations of smaller stream processing circuits.

Similarly, more complex networks of stream processing circuits may be used instead of chains. In this case, preferably, first and second multiplexers 14*a-c* and 16*a-d* are coupled in corresponding networks. If such networks have more than one external input or output to integrated circuit 10, additional multiplexers may be provided to select, under control of control circuit 18, to which of the inputs and/or outputs of the network external connections of the integrated circuit will be coupled.

Although the external connections to the input and output of the chain of first multiplexers 14*a-c* are shown as separate external terminals of integrated circuit 10, it will be understood that these connections may share external terminals with other functions (the connections being coupled to the external terminals only in the test mode for example). The inputs and outputs of the chain of first multiplexers 14*a-c* may even be coupled to the same external terminals, but it will be understood that this means input and output can be performed simultaneously only if the input and output samples are temporally multiplexed at the external terminals. Lacking such multiplexing only tests with either a test input stream or a test output stream are possible in this case.

The invention claimed is:

1. An electronic signal processing circuit, comprising:
    a plurality of chained stream processing circuits, each having a stream input and a stream output, for inputting and outputting an input and output stream of successive sample values;

linking multiplexing circuits, each linking a respective pair of stream processing circuits, each linking multiplexing circuit being individually switchable to a normal mode and to a replacement mode, the linking multiplexing circuit, when in the normal mode, providing a continuous connection for passing a first stream of samples values between the stream processing circuits in the respective pair;

a shareable communication structure coupled to the linking multiplexing circuits, each linking multiplexing circuit, when in the replacement mode, providing a continuous connection for supplying successive sample values from a second stream from the communication structure to a receiving one of the stream processing circuits in the respective pair of the stream processing circuits; and a control circuit coupled to the linking multiplexing circuits, arranged to keep a selectable one of the multiplexing circuits in the replacement mode so that the selectable one of the linking multiplexing circuits passes a stream of successive sample from the second stream to the receiving one of the processing circuits in the respective pair of the stream processing circuits, while keeping at least part of the other linking multiplexing circuits in the normal mode, the electronic signal processing circuit comprising interface circuits, each coupled between the communication structure and the stream output of a respective one of the stream processing circuits, each interface circuit being individually switchable to an output mode under control of the control circuit (IS), each interface circuit, when in the output mode, passing successive samples of the second stream or a further stream from the stream output of a respective one of the stream processing circuits to the communication structure, the electronic signal processing circuit comprising a further plurality of chained stream processing circuits, further linking multiplexing circuits, a further shareable communication structure, mutually coupled as claimed for the first mentioned plurality of chained stream processing circuits, linking multiplexing circuits, and shareable communication structure, the electronic signal processing circuit furthermore comprising a router circuit having a first, second and third input coupled to an output of the shareable communication structure, an output of the further shareable communication structure and a first external connection terminal of the electronic signal processing circuit respectively, the router circuit having a first, second and third output, coupled to an input of the shareable communication structure, an input of the further shareable communication structure and a second external connection terminal of the electronic signal processing circuit respectively, the router circuit being arranged to establish selectable connection patterns between its inputs and outputs under control of the control circuit.

2. An electronic signal processing circuit according to claim 1, wherein the communication structure comprises a plurality of chained multiplexing circuits, individually controllable by the control circuit, each chained multiplexing circuit corresponding to a respective corresponding one of the stream processing circuits, each having a first input, a second input and an output, the first input being coupled to the stream output of the corresponding one of the stream processing circuits, the second input being coupled to the output of the chained multiplexing circuit that corresponds to a preceding one of the stream processing circuit whose stream output is linked to the corresponding one of the stream processing circuit by one of the multiplexing circuits.

3. An electronic signal processing integrated circuit according to claim 2, wherein each linking multiplexing circuit has a first input and a second input, the first input coupled to the stream output of a linked one of the stream processing circuits to receive sample values from the first stream, the second input receiving the second stream which is supplied to the second input of the chained multiplexing circuits that corresponds to the linked one of the stream processing circuits.

4. An electronic signal processing circuit according to claim 2, wherein each linking multiplexing circuit has a first input and a second input, the first input coupled to the stream output of a linked one of the stream processing circuits, to receive sample values from the first stream, the second input receiving the second stream which is supplied to the second input of the chained multiplexing circuit that corresponds to the preceding one of the stream processing circuits whose stream output is linked to the input of the linked one of the stream processing circuits.

5. An electronic signal processing circuit according to claim 1, wherein the plurality of stream processing circuits is a transmission pre-processing circuit, the stream processing circuits being arranged to perform respective chained functions in the encoding of data in a transmission signal, the plurality of further stream processing circuits being a reception postprocessing circuit, the further stream processing circuits being arranged to perform respective inverse functions of the chained functions to decode data from a received signal.

6. An electronic signal processing circuit according to claim 1, comprised on an integrated circuit chip.

\* \* \* \* \*